United States Patent
Sirainen

[11] Patent Number: 5,949,019
[45] Date of Patent: Sep. 7, 1999

[54] METAL EQUIPMENT CABINET HAVING SHIELDING STRUCTURE FOR SUPPRESSING ELECTROMAGNETIC RADIATION THEREFROM

[75] Inventor: Martti Sirainen, Espoo, Finland

[73] Assignee: Nokia Telecommunications, OY, Espoo, Finland

[21] Appl. No.: 08/965,773

[22] Filed: Nov. 7, 1997

Related U.S. Application Data

[63] Continuation of application No. 08/557,195, filed as application No. PCT/FI94/00231, Jun. 2, 1994, abandoned.

[30] Foreign Application Priority Data

Jun. 3, 1993 [FI] Finland ..................................... 932545

[51] Int. Cl.⁶ .................................................. H05K 9/00
[52] U.S. Cl. .................. 174/35 R; 174/35 GC; 312/223.2; 49/492.1; 49/495.1; 49/496.1
[58] Field of Search ............................ 174/35 GC, 35 R; 361/753, 759, 799, 769, 787, 800, 816, 818; 277/920; 312/223.2; 49/492.1, 495.1, 496.1

[56] References Cited

U.S. PATENT DOCUMENTS

| | | | |
|---|---|---|---|
| 4,070,557 | 1/1978 | Ostapovitch | 439/927 |
| 4,554,400 | 11/1985 | Schmalzl | 174/35 GC |
| 4,640,979 | 2/1987 | Schmalzl | 174/35 GC |
| 5,039,825 | 8/1991 | Samarov | 174/35 GC |
| 5,138,529 | 8/1992 | Colton et al. | 361/424 |
| 5,225,629 | 7/1993 | Garrett | 174/35 R |

FOREIGN PATENT DOCUMENTS

| | | | |
|---|---|---|---|
| 0 424 806 | 5/1991 | European Pat. Off. | |
| 93-20676 | 10/1993 | European Pat. Off. | H05K 9/00 |
| 1275798 | 12/1986 | U.S.S.R. | |
| 92/17046 | 10/1992 | WIPO | |

*Primary Examiner*—Kristine Kincaid
*Assistant Examiner*—Hung V Ngo
*Attorney, Agent, or Firm*—Pillsbury Madison & Sutro LLP

[57] ABSTRACT

A shielding structure for suppressing interference radiation in an electric field between abutting surfaces of two separate parts of a metallic device cabinet. The structure is formed by a spring element, at least the outer surface of which is made of an electrically conductive material. The spring element has two substantially parallel branches which are fastened to one of the parts to be shielded at least in one opening made in this part, to project towards a contact surface of the other part.

4 Claims, 1 Drawing Sheet

METAL EQUIPMENT CABINET HAVING SHIELDING STRUCTURE FOR SUPPRESSING ELECTROMAGNETIC RADIATION THEREFROM

This is a continuation of application No. 08/557,195, filed on Mar. 14, 1996, which was abandoned upon the filing hereof, which claims the benefit of being filed as international application PCT/FI94/00231 filed Jun. 2, 1994.

BACKGROUND OF THE INVENTION

The invention relates to a shielding structure for suppressing interference radiation in an electric field between abutting surfaces of two separate parts of a metallic device cabinet.

In a telephone exchange, for instance, electronic devices generating high-frequency current pulses create electromagnetic interference at radio frequency, which interference radiates to the environment and may be rather strong.

For this interference level, there have been defined international standards to be fulfilled by telephone exchanges, for instance. Measurements have shown the need of suppression to be about 35 decibels.

Since it is difficult and expensive to suppress interference in printed circuit cards, cables and contactors, electric insulation of a device cabinet is of decisive significance (cf. Faraday cage). This presupposes that no long joints or openings are allowed in the shell structure of the device cabinet or they have to be shielded electrically by ensuring conductive contact points at sufficient intervals. The most difficult objects of shielding are device cabinet doors to be opened.

Many kinds of shielding solutions are commercially available. One such solution is known e.g. from Finnish Patent 79439. According to that, document expensive metal insulators are used between parts to be insulated and, to provide a sufficient compressive force, pressed against surfaces to be insulated by means of a lever arm mechanism of a special structure, which makes it difficult to shut the door to be insulated, for instance.

Another known solution is disclosed by Finnish Patent 86788, in which to a profile at a frame of a device cabinet is arranged an insulator of coil spring type having an angular cross-section, which insulator comes into contact with the edge of the door when the edge of the door is pushed into the profile. When the edge of the door is between one wall of the profile and the insulator, threadings of the insulator are in a slanting position, due to which the angular edges of the insulator are pressed both against the door and the other wall of the profile, thus providing a good metallic contact and a good electric insulation. However, this special arrangement is expensive and damageable. This is a bad solution also as far as the use is concerned, because shutting the door is difficult. In addition, such sharp-edged doors are dangerous.

On the other hand, U.S. Pat. No. 5,107,071 discloses a sealing structure, in which in a cavity in one part to be sealed is placed a sealing member made of an electrically conductive material together with a member made of an elastic and deformable material pressing the sealing member tightly against the wall of the cavity and the other part to be sealed, when the other part to be sealed is pressed against said elastic and deformable member. However, considerably strong compressive forces are required to provide a good insulation. Additionally, this solution also has the drawback of being expensive.

SUMMARY OF THE INVENTION

The object of the present invention is to eliminate the drawbacks described above and to provide an efficient shielding in a simple manner. This object is achieved by means of a shielding structure, which is according to the invention characterized in that the structure includes a spring element, at least the outer surface of which is made of an electrically conductive material, the spring element having two substantially parallel branches and being fastened to the part to be shielded at least in one opening made in this part to project towards a contact surface of the opposite part.

The shielding structure according to the invention is very advantageous, because it can be manufactured in whole, e.g. of round mosaic gold wire. Then, the contact surface may also be shaped easily to a spotlike form, on account of which a reliable contact is provided by little spring force. A zinc electroplated planar surface, for instance, is sufficient for a contact surface. The structure means according to the invention can be fastened without separate fastening means, it is practically unbreakable and it is not sharp. Additionally, its two parallel branches prevent it efficiently from buckling sidewards.

BRIEF DESCRIPTION OF THE DRAWINGS

The invention will be described in the following by means of one preferred embodiment thereof referring to the attached drawing, in which.

DETAILED DESCRIPTION

Figure 1:
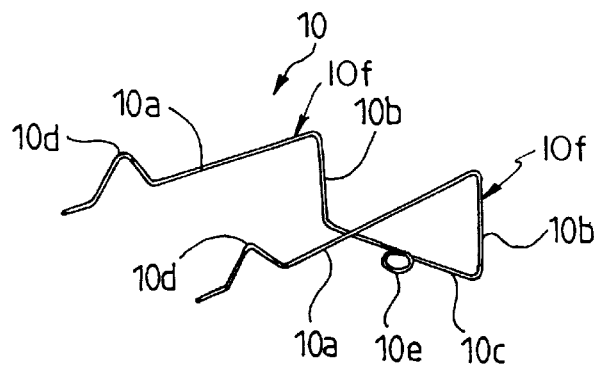
FIG. 1 shows a perspective view of a shielding structure according to the invention.

An shielding structure 10 shown in the figures is manufactured by bending one round wire (i.e. which is round in transverse crosssectional shape) of, e.g., mosaic gold, behaving like a spring, the thickness of the wire being preferably about 0.8 mm. The structure comprises two parallel L-shaped out portion 10 extending at a distance from each other, whereby branches 10a and 10b, being approximately perpendicular to each other portion, are mutually substantially parallel from one outer portion to the other. The out portions are in contact with each other by means of the intermediate portion 10c connecting the ends of the shorter branches 10b. Bends 10d projecting from the lines formed by the branches 10a are provided close to the outer ends of the longer branches 10a, the peaks of the bends acting as contact surfaces of the structure. On the other hand, the intermediate portion 10c is provided with a link 10e for fastening the structure to the part to be shielded.

Figure 2:
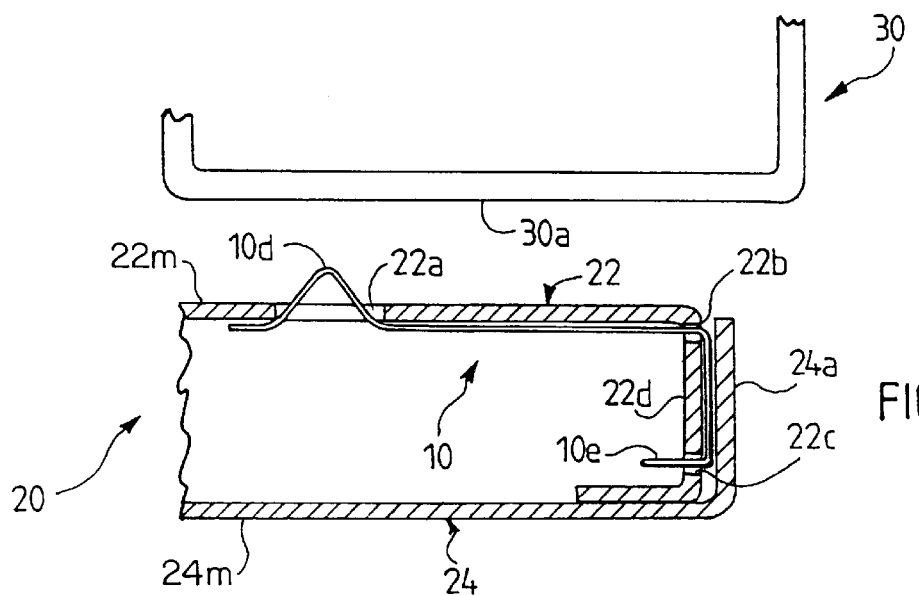
FIG. 2 shows the shielding structure of FIG. 1 mounted in a door of a metallic device cabinet.
Figure 3:
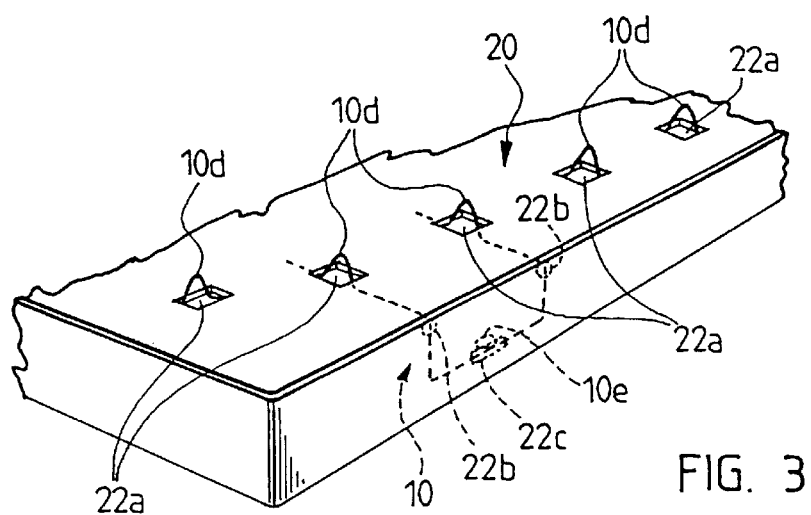
FIG. 3 shows a perspective view of a part of the door of the device cabinet of FIG. 1, in which door are mounted shielding structure according to FIG. 1.

FIGS. 2 and 3 show one or several shielding structures 10 arranged in a door 20 of a metallic device cabinet in such a way that each bend portion 10d projects from an opening 22a made in the door 20 for this purpose towards a contact surface 30a of an opposite frame 30 of the device cabinet.

The door 20 comprises two parts 22 and 24 each having a respective main panel 22m, 24m, and a respective edge bend 22d, 24a. The inner part 22 is received within the outer part 24. The shielding structures 10, i.e. its longer branches 10a, is slipped into place through openings 22b made in the edge bend 22d of the inner part 22 of the door and the structure being locked into place in an opening 22c situated lower in the edge bend 22d by means of the link 10e of the intermediate portion 10c. Additionally, the shorter branches 10b of the shielding structures 10 stay tightly in the ready assembled door 20 between the edge bend 22*d* of the inner part 22 of the door and a respective edge bend 24*a* of the outer part 24 of the door. Because the shielding structure 10 is thus locked firmly in place at its shorter branch portions 10*b* only, the longer branch portions 10*a* are freely resilient towards the hollow inside of the door 20.

As is seen from FIG. 3, a necessary number of shielding structure 10, depending on the length of the joints of the door 20 to be shielded, are mounted in the door in parallel. In telephone exchanges, for instance, the distance between the contact points, i.e. the distance between the bend portions 10*d* of the shielding structure 10 itself and those of the adjacent shielding structure 10, has to be less than 30 mm.

The invention has been described above by means of one preferred embodiment only. However, one skilled in the art is able to implement its details in a number of alternative manners within the scope of the attached claims. So, the structure may have one branch or the number of branches may be higher than two, for instance. The structure does not need to be manufactured of wire, either, for the only essential thing is that a good contact by little spring force is provided. For example, a leaf spring having a spotlike contact portion projecting towards the contact surface would be conceivable. Moreover, the structure may be fastened in a freely selectable way, but still preferably in such a way that no separate fastenings are required. The structure may also be positioned in either one of the parts to be shielded and both parts to be shielded may comprise such structure. The shielding structure does not need to be made of an electrically conductive material in whole, but it may also be made of a non-conductive material which is coated with an electrically conductive material.

I claim:

1. An electromagnetic field interference-suppressing cabinet for a device comprising:

a metallic cabinet having opened and closed conditions and being adapted to house electrical or electronic equipment, said cabinet allowing electromagnetic energy to radiate outwardly from said cabinet, said electromagnetic energy when strongly radiating from said cabinet being capable of causing unacceptable electromagnetic interference at a radio frequency, said cabinet comprising a first part comprising a first portion and a second part comprising a second portion, said first portion being confrontingly opposed in juxtaposition with said second portion when said cabinet is in said closed condition; and a shielding structure comprising a spring externally made of an electrically conductive material, said spring comprising an intermediate portion, a fastener provided on said intermediate portion, and opposite first and second ends, said intermediate portion integrally joining said first and second ends, said first and second ends comprising respective first and second outer portions substantially parallel with each other and comprising respective first and second distal ends, each of said first and second distal ends comprising a bent portion defining a peak;

said first part of said cabinet comprising a first surface and two openings formed through said first surface, said second part of said cabinet comprising a first surface, said first surface of said second part opposing said first surface of said first part when said cabinet is in said closed condition, said peaks of said first and second distal ends protruding through said two openings through said first surface of said first part along a direction generally orthogonal to said first surface of said second part, and said fastener being fastened to said first part;

said first part further comprising another opening, said fastener being fastened to said first part by being inserted into said another opening;

said first part comprising a door comprising an outer door part having a main panel and an edge bend, and an inner door part having a main panel and an edge bend; said first surface being provided in said main panel of said inner door part; said another opening being provided in said edge bend of said inner door part; said edge bend of said outer door part overlapping said edge bend of said inner door part; and said first and second outer portions of said spring each being L-shaped and having a first branch provided with a respective said peak and extending between said main panel of said inner door part and said main panel of said outer door part, and a second branch extending out through a respective further opening provided through said edge bend of said inner door part and said second branch extending between said edge bend of said inner door part and said edge bend of said outer door part; and said fastener extending between said main panel of said inner door part and said main panel of said outer door part and extending through said another opening.

2. The cabinet of claim 1, wherein:

said cabinet comprises a plurality of shielding structures.

3. The cabinet of claim 1, wherein:

said spring is made of mosaic gold wire having a round transverse cross-sectional shape.

4. The cabinet of claim 3, wherein:

said fastener is a loop formed in said wire.

* * * * *